US008143660B2

(12) United States Patent
Lee et al.

(10) Patent No.: US 8,143,660 B2
(45) Date of Patent: Mar. 27, 2012

(54) METHOD FOR MANUFACTURING OXIDE FILM HAVING HIGH DIELECTRIC CONSTANT, CAPACITOR HAVING DIELECTRIC FILM FORMED USING THE METHOD, AND METHOD FOR MANUFACTURING THE SAME

(75) Inventors: Jung-hyun Lee, Gyeonggi-do (KR); Burn-seok Seo, Seoul (KR); Yo-sep Min, Gyeonggi-do (KR); Young-jin Cho, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 215 days.

(21) Appl. No.: 10/797,046

(22) Filed: Mar. 11, 2004

(65) Prior Publication Data

US 2004/0238872 A1 Dec. 2, 2004

(30) Foreign Application Priority Data

Mar. 11, 2003 (KR) .................. 10-2003-0015197

(51) Int. Cl.
 *H01L 27/108* (2006.01)
(52) U.S. Cl. ....................................... 257/310; 257/296
(58) Field of Classification Search .................. 257/296, 257/310
See application file for complete search history.

(56) References Cited

U.S. PATENT DOCUMENTS

| | | | | |
|---|---|---|---|---|
| 3,996,021 | A * | 12/1976 | Chang et al. | 428/564 |
| 6,020,024 | A | 2/2000 | Maiti et al. | |
| 6,486,080 | B2 * | 11/2002 | Chooi et al. | 438/785 |
| 6,844,604 | B2 * | 1/2005 | Lee et al. | 257/410 |
| 6,930,059 | B2 * | 8/2005 | Conley et al. | 438/785 |
| 6,936,881 | B2 * | 8/2005 | Yeo et al. | 257/310 |
| 7,112,539 | B2 * | 9/2006 | Lee et al. | 438/763 |
| 2002/0014647 | A1 * | 2/2002 | Seidl et al. | 257/301 |
| 2002/0106536 | A1 | 8/2002 | Lee et al. | |

FOREIGN PATENT DOCUMENTS

| | | |
|---|---|---|
| KR | 10-2001-00228836 A | 4/2001 |
| KR | 10-2002-0002991 A | 1/2002 |
| KR | 1020020032054 | 5/2002 |
| KR | 1020030002298 | 1/2003 |

OTHER PUBLICATIONS

Korean Office Action dated Jan. 11, 2010, in corresponding Korean Application No. 10-2003-0015197, with English translation. Sneh, Oler et al., *Thin film atomic layer deposition equipment for semiconductor processing*, Thin Solid Films 402 (2002) 248-261.
Office Action issued by Chinese Patent Office on Mar. 21, 2007 for Cinese Patent Application No. 2004100283929.
English Translation of Office Action by Chinese Patent Office on Mar. 21, 2007 for Chinese Patent Application No. 2004100283929.
English translation of Korean Office Action dated Nov. 8, 2011 in corresponding Korean Application No. 10-2003-0015197.

* cited by examiner

*Primary Examiner* — Ori Nadav
(74) *Attorney, Agent, or Firm* — Harness, Dickey & Pierce, P.L.C.

(57) ABSTRACT

Provided are a method for manufacturing a high k-dielectric oxide film, a capacitor having a dielectric film formed using the method, and a method for manufacturing the capacitor. A high k-dielectric oxide film is manufactured by (a) loading a semiconductor substrate in an ALD apparatus, (b) depositing a reaction material having a predetermined composition rate of a first element and a second element on the semiconductor substrate, and (c) forming a first high k-dielectric oxide film having the two elements on the semiconductor substrate by oxidizing the reaction material such that the first element and the second element are simultaneously oxidized. In this method, the size of an apparatus is reduced, productivity is enhanced, and manufacturing costs are lowered. Further, the high k-dielectric oxide film exhibits high dielectric constant and low leakage current and trap density. Thus, a capacitor including the high k-dielectric oxide film as a dielectric film also exhibits low leakage current and trap density.

1 Claim, 10 Drawing Sheets

METHOD FOR MANUFACTURING OXIDE FILM HAVING HIGH DIELECTRIC CONSTANT, CAPACITOR HAVING DIELECTRIC FILM FORMED USING THE METHOD, AND METHOD FOR MANUFACTURING THE SAME

BACKGROUND OF THE INVENTION

This application claims the priority of Korean Patent Application No. 2003-15197, filed on Mar. 11, 2003, in the Korean Intellectual Property Office, the disclosure of which is incorporated herein in its entirety by reference.

1. Field of the Invention

The present invention relates to a method for manufacturing a material film, a capacitor formed using the method, and a method for manufacturing the same. More specifically, the present invention relates to a method for manufacturing an oxide film having high dielectric constant, a capacitor having a dielectric film formed using the method, and a method for manufacturing the same.

2. Description of the Related Art

As the integration density of semiconductor devices, such as DRAMs, increases, manufacturing gate oxide films or capacitors using a silicon oxide ($SiO_2$) film becomes more complicated. Thus, more attention is given and studies are done for materials having a dielectric constant that is higher than that of the silicon oxide film.

Materials having high dielectric constant (hereinafter, referred to as "high k-dielectric materials") are aluminum oxide ($Al_2O_3$) films, hafnium oxide ($HfO_2$) films, and the like. In particular, there have been intensive studies on multi-layered structures in which an aluminum oxide film having relatively low leakage current and a hafnium oxide film having relatively high dielectric constant are sequentially stacked.

In recent years, attempts have been made to form capacitors or gate oxide films of DRAMs using high k-dielectric materials, such as $HfO_2$, $ZrO_2$, and $SrTiO_3$. However, in a metal/insulator/silicon (MIS) structure in which a lower electrode is formed of silicon (Si), since the high k-dielectric materials generally have low band offset, leakage current increases. For this reason, it is actually difficult to apply these high k-dielectric materials to the MIS structure.

As a result, a method for forming an aluminum oxide film, which has relatively low dielectric constant and high band offset for a silicon film, between a silicon film and a high k-dielectric material is being developed to reduce the leakage current. For example, costly studies are being done on a multi-layered structure in which a silicon film, an aluminum oxide ($Al_2O_3$) film, and a high k-dielectric material are sequentially stacked.

FIGS. 1 through 3 show a conventional method of manufacturing a high k-dielectric oxide film as a multi-layered structure.

Referring to FIG. 1, an oxidation barrier film 12 is formed on a silicon film 10. The oxidation barrier film 12 is a nitride film formed using rapid thermal process (RTP). After the oxidation barrier film 12 is formed, as shown in FIG. 2, an aluminum oxide film 14 is formed on the oxide barrier film 12. Next, as shown in FIG. 3, a hafnium oxide film 16 having a dielectric constant that is higher than that of the aluminum oxide film 14 is formed on the aluminum oxide film 14. Reference numeral 18 denotes an imagined upper electrode formed of polysilicon.

In the conventional method for manufacturing a high k-dielectric oxide film, by which an aluminum oxide film and a hafnium oxide film are sequentially stacked, the capacitance of a capacitor cannot be sufficiently increased due to low dielectric constant of the aluminum oxide film. Also, because the aluminum oxide film and the hafnium oxide film must be formed at different temperatures, two different atomic layer deposition (ALD) apparatuses are required.

That is, according to the conventional method, at least two ALD apparatuses are required. Also, the deposition rate of a hafnium oxide film is lower than that of an aluminum oxide film, thus lowering the productivity. Further, as a high k-dielectric oxide film may be crystallized during a thermal treatment performed after a capacitor is completed, the leakage current may increase.

SUMMARY OF THE INVENTION

The present invention provides a method for manufacturing a high k-dielectric oxide film, by which the size of a used apparatus is reduced and productivity is enhanced.

The present invention also provides a capacitor of a semiconductor device formed using the method for manufacturing a high k-dielectric oxide film.

The present invention further provides a method for manufacturing the capacitor.

In accordance with an aspect of the present invention, there is provided a method for manufacturing a high k-dielectric oxide film, which comprises (a) loading a semiconductor substrate in an ALD apparatus, (b) depositing a reaction material having a predetermined composition rate of a first element and a second element on the semiconductor substrate, and (c) forming a first high k-dielectric oxide film having the two elements on the semiconductor substrate by oxidizing the reaction material such that the first element and the second element are simultaneously oxidized.

The method of the present invention may further comprises exhausting residue from the ALD apparatus after the first high k-dielectric oxide film is formed and forming a second high k-dielectric oxide film on the first high k-dielectric oxide film by repeating steps (b) and (c).

Step (b) comprises supplying a first precursor having the first element to the ALD apparatus to absorb the first precursor on the semiconductor substrate, exhausting residue from the ALD apparatus, supplying a second precursor having the second element, which reacts with the first element, to the ALD apparatus, and exhausting residue from the ALD apparatus.

Preferably, the first precursor is a composition of the first element and one of chlorine (Cl) and fluorine (F) having high electronegativity, while the second precursor is a composition of the second element and a ligand of hydrocarbon series having an electronegativity that is lower than that of the chlorine or fluorine. Here, the ligand of hydrocarbon series may be $(CH_2-CH_2-\ldots-CH_3)_3$ or a composition whose partial H of $(CH_2-CH_2-\ldots-CH_3)_3$ is substituted for $CH_2-CH_2-\ldots-CH_3$.

Before the semiconductor substrate is loaded in the ALD apparatus, an oxidation barrier film can be formed on the semiconductor substrate.

The first element and the second element may preferably be hafnium (Hf) and aluminum (Al), respectively. The first high k-dielectric oxide film may be an AHO(($Al_x$,$Hf_{1-x}$)$O_y$) film, and the second high k-dielectric oxide film may be formed of an AHO film or a dielectric film having a dielectric constant that is higher than that of an AHO film.

A third high k-dielectric oxide film, e.g., a dielectric film having a dielectric constant that is higher than that of the AHO film, may be further formed on the first high k-dielectric film.

The third high k-dielectric oxide film is formed in a deposition apparatus other than the ALD apparatus.

In accordance with another aspect of the present invention, there is provided a capacitor of a semiconductor device, which comprises a lower electrode, an AHO($(Al_xHf_{1-x})O_y$) film formed on the lower electrode, and an upper electrode formed on the AHO film.

In accordance with yet another aspect of the present invention, there is provided a method for manufacturing a capacitor of a semiconductor device, which comprises (a) forming a lower electrode on a semiconductor substrate, (b) loading the semiconductor substrate on which the lower electrode is formed in an ALD apparatus, (c) depositing a reaction material having a predetermined composition rate of a first element and a second element on the lower electrode in the ALD apparatus, (d) forming a first high k-dielectric oxide film having the two elements on the lower electrode by oxidizing the reaction material such that the first element and the second element are simultaneously oxidized, (e) unloading the resultant structure where the first high k-dielectric oxide film is deposited from the ALD apparatus, and (f) forming an upper electrode on the first high k-dielectric oxide film.

The method of the present invention may further comprise exhausting residue from the ALD apparatus after the first high k-dielectric oxide film is formed and forming a second high k-dielectric oxide film on the first high k-dielectric oxide film by repeating steps (c) and (d).

Step (c) is the same as in the method for manufacturing the high k-dielectric oxide film.

Before the semiconductor substrate is loaded in the ALD apparatus, an oxidation barrier film may be formed on the lower electrode.

Before the upper electrode is formed, a third high k-dielectric oxide film may be formed in a different method from the method in which the second high k-dielectric oxide film is formed. For example, the third high k-dielectric oxide film may be formed of a dielectric film having a dielectric constant that is higher than that of an AHO film and using a deposition apparatus other than the ALD apparatus, e.g., a CVD apparatus.

According to the present invention, the size of a used deposition apparatus can be reduced without degrading characteristics of high k-dielectric oxide films. Also, the time required for deposition can be saved, thus enhancing productivity.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
FIGS. 1 through 3 are cross-sectional views illustrating a conventional method for manufacturing a high k-dielectric oxide film.
Figure 2:
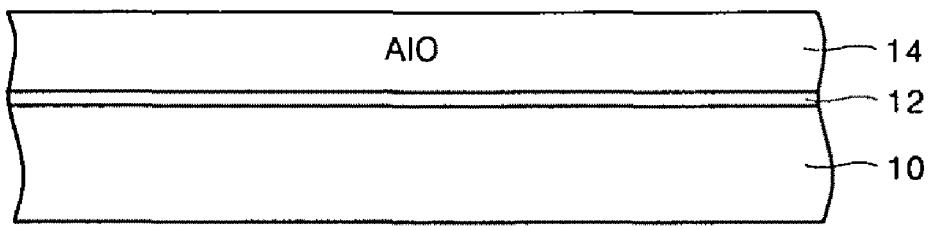
Figure 3:
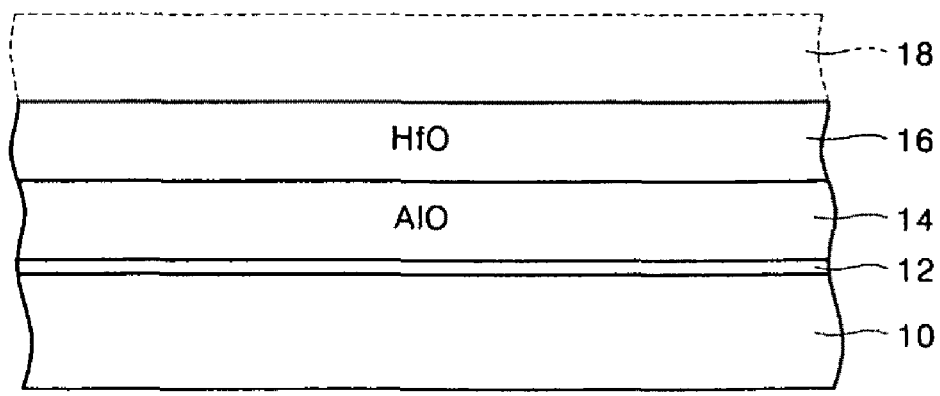

A method for manufacturing a high k-dielectric oxide film, a capacitor having a dielectric film formed using the method, and a method for manufacturing the capacitor according to embodiments of the present invention will be described in detail with reference to the accompanying drawings. In the drawings, the shape of elements has been exaggerated for clarity.

In the following description, a method for manufacturing a high k-dielectric oxide film having high dielectric constant as well as low leakage current and low trap density by using a chemical reaction between a precursor containing aluminium and another precursor used for depositing a high k-dielectric material layer, a capacitor having a high k-dielectric oxide film formed using the method, and a method for manufacturing the capacitor are provided.

To begin with, the method for manufacturing a high k-dielectric oxide film according to embodiments of the present invention will be described with reference to FIGS. 4 through 13.

Figure 4:
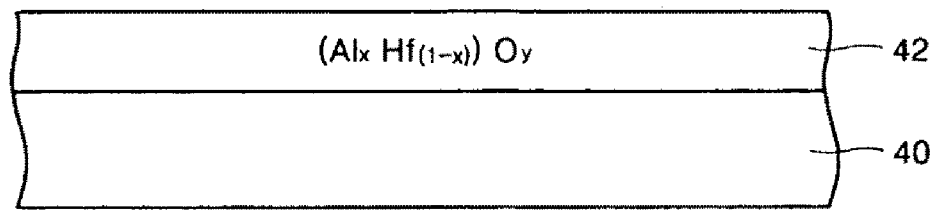
FIGS. 4 through 13 are cross-sectional views illustrating a method for manufacturing a high k-dielectric oxide film according to embodiments of the present invention.
Figure 5:
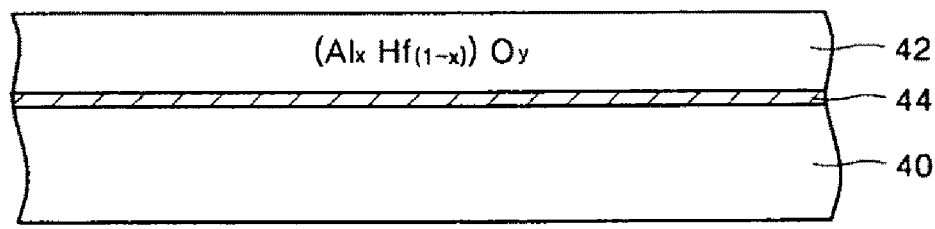

FIGS. 4 and 5 are cross-sectional views of the resultant structures formed according to the first embodiment and the second embodiment of the present invention, respectively. In FIGS. 4 and 5, reference numeral 40 denotes a semiconductor substrate and 42 denotes an AHO($(Al_xHf_{1-x})O_y$) film. In FIG. 5, reference numeral 44 denotes an oxidation barrier film formed between the semiconductor substrate 40 and the AHO film 42, for example, a rapidly thermal-treated nitride film (hereinafter, referred to as an "RTN layer").

Embodiment 1

Figure 6:
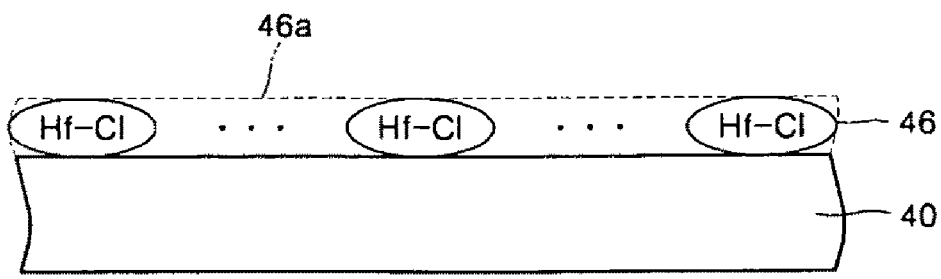

A semiconductor substrate where a high k-dielectric oxide film will be formed, e.g., a silicon substrate, is loaded on a wafer stage of an ALD apparatus (not shown). Next, a predetermined amount of a first precursor containing a first element, e.g., hafnium (Hf), is supplied to the ALD apparatus and chemisorbed on the surface of the semiconductor substrate 40, as shown in FIG. 6. The first precursor 46 is a composition of the first element and a ligand having high electronegativity, such as Cl and F. For example, the first precursor 46 is $HfCl_4$. Part of the first precursor, which is not absorbed on the surface of the semiconductor substrate 40, is exhausted from the ALD apparatus. Afterwards, a second precursor containing a second element, e.g., aluminium (Al), which reacts with the first element of the first precursor 46, is supplied to the ALD apparatus. The second precursor is a composition of the second element and a ligand of hydrocarbon series, for example, $Al(CH_3)_3$, $Al(CH_2-CH_2-\ldots$ —CH$_3$)$_3$, or a composition whose one H of Al(CH$_2$—CH$_2$— ... —CH$_3$)$_3$ is substituted for CH$_2$—CH$_2$— ... —CH$_3$. The ligand of hydrocarbon series has an electronegativity that is lower than that of Cl or F contained in the first precursor.

Because the electronegativity of the ligand of the first precursor is different from that of the ligand of the second precursor, for example, chlorine included in the first precursor easily reacts with the element of hydrocarbon series included in the second precursor. By this reaction, the ligands of the first and second precursors are removed as by-products. As a result, a reaction material obtained by chemisorbing the first element and the second element is deposited on the semiconductor substrate 40.

Figure 7:
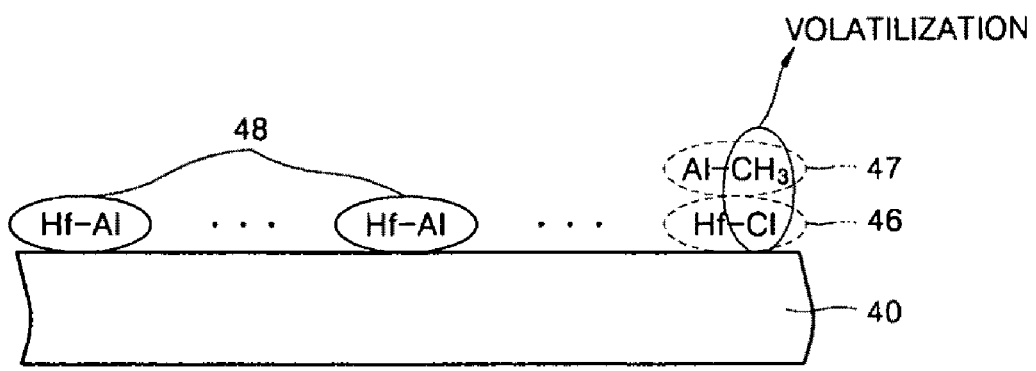
Figure 8:
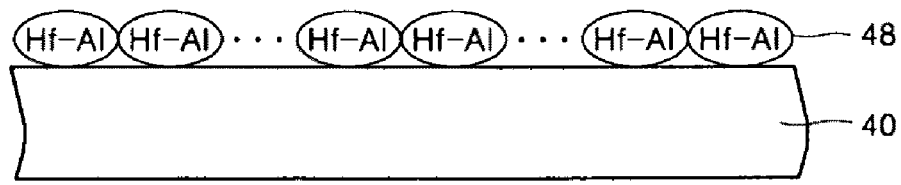

Specifically, as shown in FIG. 7, a chemical reaction occurs between the second precursor 47 and the first precursor 46. The ligand (—Cl) of the first precursor 46 and the ligand (—CH$_3$) of the second precursor 47 are combined and volatilized, thus filling the vacancy formed by removing the ligand of the first precursor 46 with aluminium included in the second precursor 47. As a result, as shown in FIG. 8, a reaction material (Hf—Al) 48 including two positive ions, i.e., Hf ions and Al ions, is uniformly formed on the semiconductor substrate 40.

Figure 9:
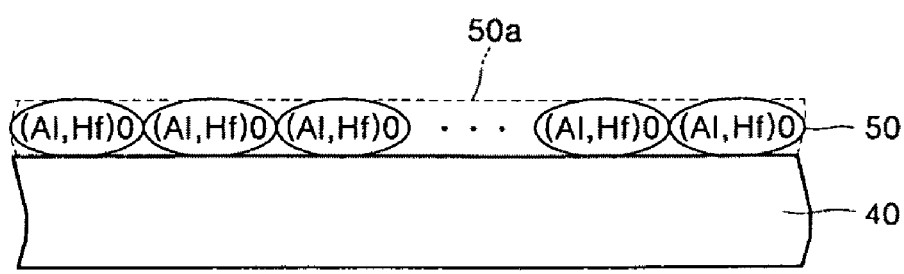
Figure 10:
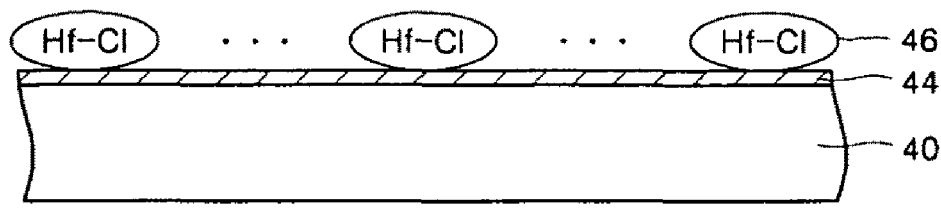
Figure 11:
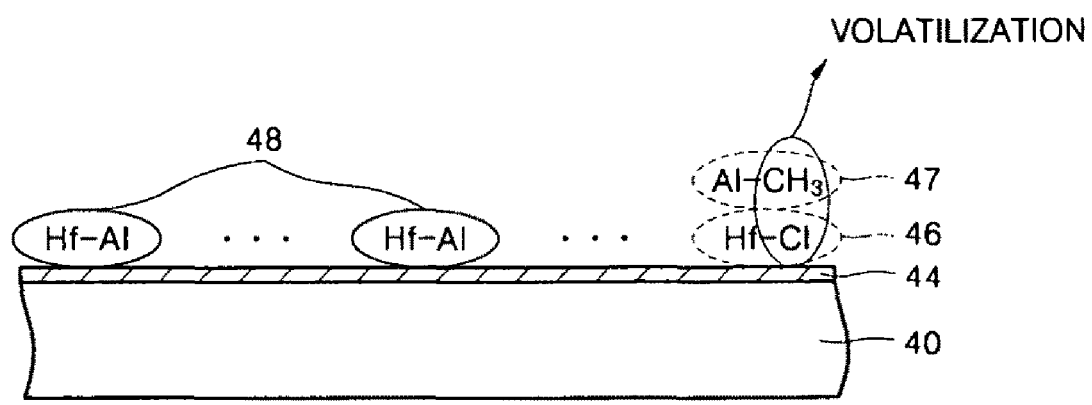
Figure 12:
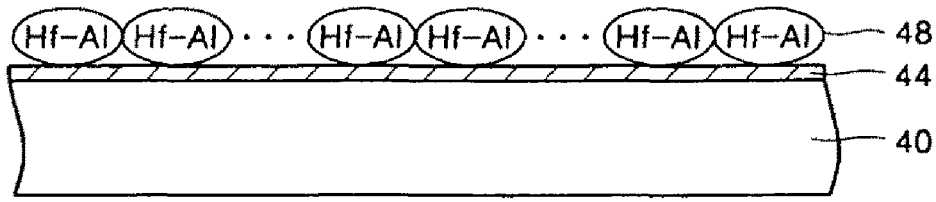
Figure 13:
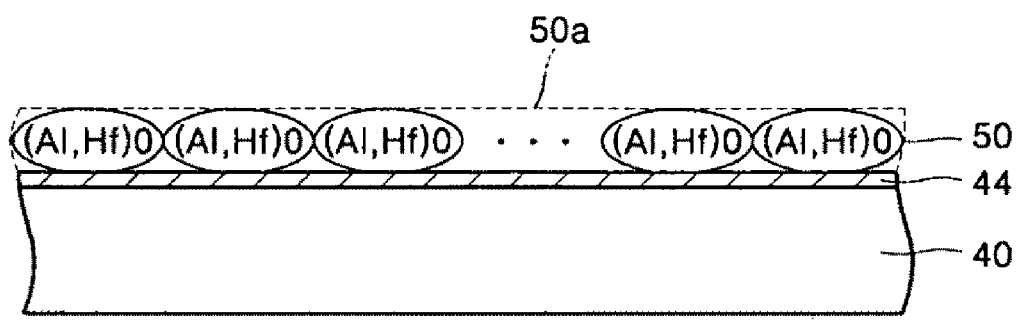

Afterwards, a predetermined amount of oxidant gas, such as O$_3$ and H$_2$O, for oxidizing the reaction material 48, is supplied onto the semiconductor substrate 40 where the reaction material 48 is formed. The oxidant gas reacts on hafnium and aluminium at the same time. That is, the reaction material 48 formed on the semiconductor substrate 40 is oxidized, thereby forming an oxidant ((Al$_X$,Hf$_{1-X}$)O$_Y$) 50 on the semiconductor substrate 40, as shown in FIG. 9. In the oxidant ((Al$_X$,Hf$_{1-X}$)O$_Y$) 50, value "X" ranges from 0.1 to 0.9 and value "Y" ranges from 2 to 5. In FIG. 9, reference numeral 50$a$ denotes a high k-dielectric oxide film formed of the oxidant 50, i.e., an AHO layer.

Supplying the first precursor 46 through oxidizing the reaction material 48 are preferably performed at a predetermined temperature, for example, 250° C. to 400° C., and more preferably at 300° C.

Figure 14:
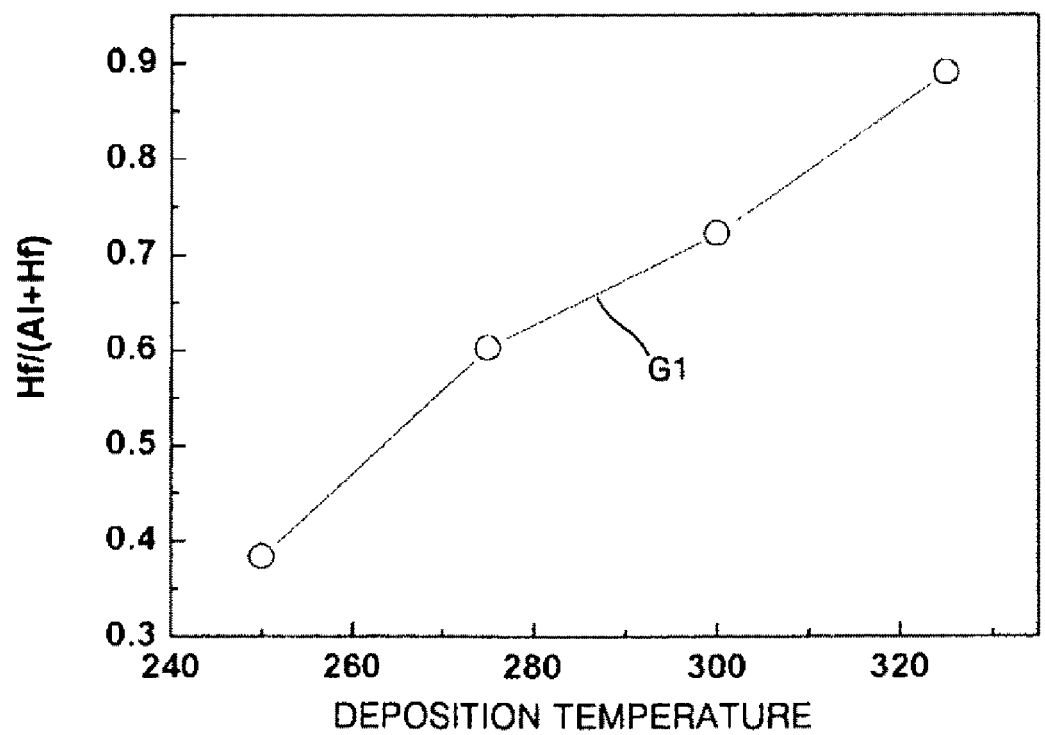
FIG. 14 is a graph showing variation of the composition rate of an oxide film with respect to the deposition temperature, which affects the method for manufacturing a high k-dielectric oxide film according to the embodiments of the present invention.

However, as shown in FIG. 14, since the composition rate (Hf/(Al+Hf)) of the reaction material 48 varies according to the temperature, the composition rate can be adjusted by controlling the temperature and the foregoing exemplary temperature range can be changed. For example, in a case where the reaction material 48 has a particular composition rate, thus exhibiting excellent leakage current characteristic and/or dielectric constant characteristic, the exemplary process temperature is changed to a temperature at which the reaction material 48 has the particular composition rate.

In FIG. 14, reference character G1 denotes a first curve showing variation of the composition rate of the reaction material 48 with respect to the process temperature.

Next, as shown in FIG. 9, a high k-dielectric oxide film 50$a$ is formed on the semiconductor substrate 40, and then an exhaust process is carried out to remove remaining gas from the ALD apparatus. Afterwards, supplying the first precursor 46 through oxidizing the reaction material 48 through exhausting remaining gas are repeated n times until a high k-dielectric oxide film is deposited on the semiconductor substrate 40 to a desired thickness. After the final exhaust process is performed, the completed high k-dielectric oxide film is thermally treated at a predetermined temperature.

Embodiment 2

As shown in FIGS. 10 through 13, manufacturing steps in a second embodiment are the same as those in the first embodiment except that supplying the first precursor 46 through the final step are performed after an oxidation barrier film 44 is formed on the semiconductor substrate 40. The oxidation barrier film 44 is a nitride film obtained by loading the semiconductor substrate 40 in a furnace of a nitrogen atmosphere and treating it using RTP for a predetermined duration of time. The oxidation film 44 can prevent a reaction between a dielectric material and silicon, which are deposited on the semiconductor substrate 40. Thus, the dielectric constant of the dielectric material can be stably maintained. The oxidation barrier film 44 may be formed of silicon oxynitride (SiON).

Hereinafter, characteristics of the high k-dielectric oxide film according to the embodiments of the present invention will be described based on the measurement results.

Figure 15A:
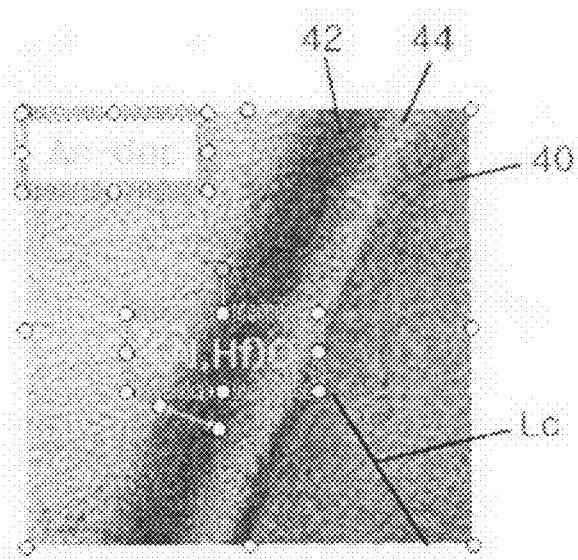
FIGS. 15A and 15B are a transmission electron microscope (TEM) showing the extent of crystallization of a stacked structure, taken immediately after a high k-dielectric oxide film is formed according to the embodiments of the present invention and a graph showing EDS analysis results, respectively.
Figure 15B:
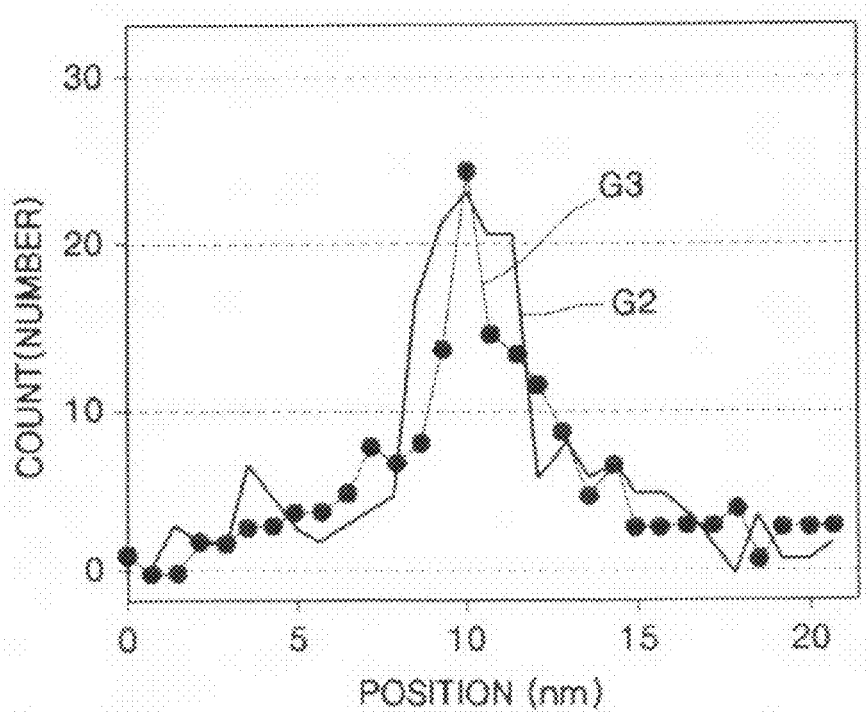
Figure 16A:
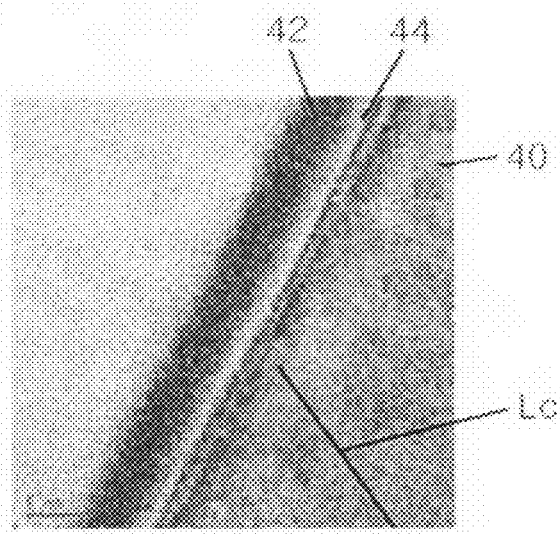
FIGS. 16A and 16B are a TEM showing the extent of crystallization of the stacked structure, taken after annealing the resultant structure where the high k-dielectric oxide film is formed and a graph showing EDS analysis results, respectively.
Figure 16B:
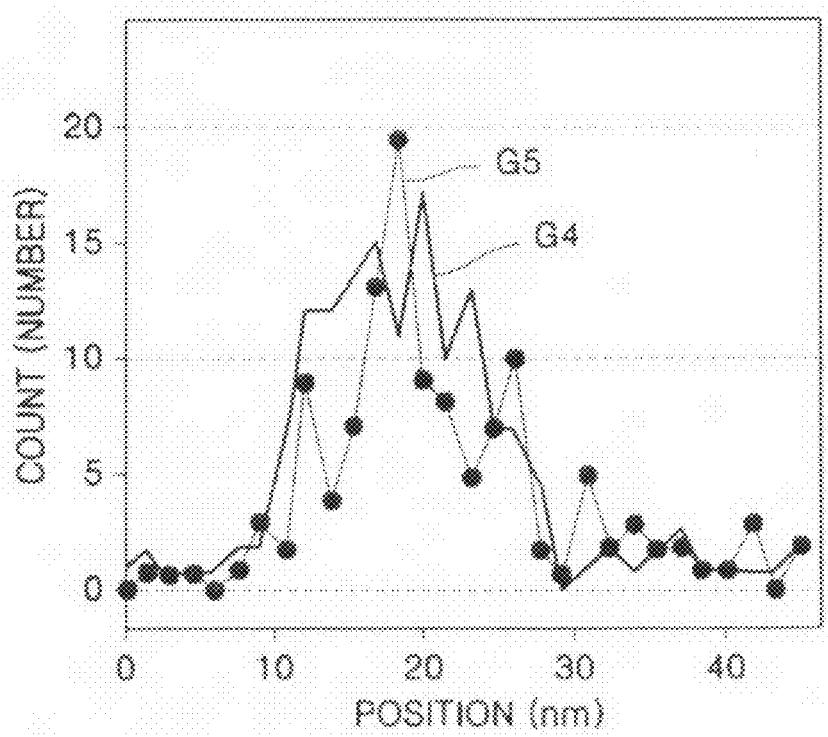

FIG. 15A is a TEM showing the extent of crystallization of an AHO film formed according to the present invention, and FIG. 15B shows a second curve G2 and a third curve G3, which show variations of the contents of hafnium and aluminum, respectively, with respect to the position of the AHO layer. FIGS. 15A and 15B show results measured immediately after the AHO film is formed and before the AHO film is thermally treated for crystallization. Meanwhile, FIGS. 16A and 16B are similar to FIGS. 15A and 15B except that measurement results are obtained after the AHO film is thermally treated for crystallization. In FIG. 16B, reference characters G4 and G5 denote a fourth curve and a fifth curve, respectively, which correspond to the second curve G2 and the third curve G3, respectively.

Referring to FIG. 15A, a crystallization line Lc of the semiconductor substrate 40 ends at an interface between the semiconductor substrate 40 and the oxidation barrier film 44. Also, FIG. 16A shows the same result as in FIG. 15A. Accordingly, it can be inferred that in the present invention, the crystallization of the AHO film can be suppressed during the thermal treatment.

In the present invention, because the AHO film is formed to a thin thickness of about 30 Å, the crystallization of the AHO film not decreases but increases the leakage current. Therefore, as shown in FIGS. 15A and 16A, if the crystallization of the AHO film is suppressed, the leakage current can also be suppressed.

Here, the suppressed extent of the leakage current of the AHO film is closely related with the composition rate of the AHO layer. Thus, the suppressed extent of the leakage current is affected by the deposition temperature of the reaction material 48.

In FIGS. 15B and 16B, the horizontal axis represents the measurement positions. The measurement positions are distributed in a vertical direction from the surface (position "0") of the AHO film 42 formed on the semiconductor substrate 40 to the semiconductor substrate 40 (position "20" or "40").

Referring to the second through fifth curves G2, G3, G4, and G5 of FIGS. 15B and 16B, the contents of hafnium and aluminum contained in the AHO layer, measured before the final thermal treatment for crystallization (G2 and G3), are similarly distributed to distribution of those measured after the final thermal treatment (G4 and G5). Based on the result, even after the completion of the final thermal treatment, the distribution of the contents of hafnium and aluminum contained in the AHO layer remains.

Figure 17A:
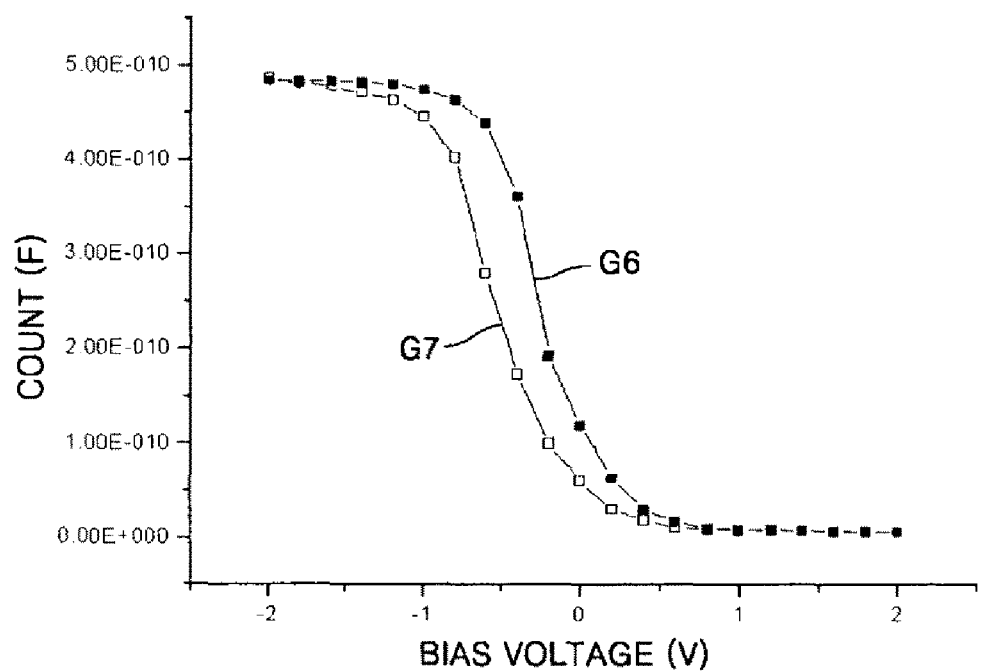
FIGS. 17A and 17B are graphs showing capacitance-voltage (C-V) variation with respect to a high k-dielectric oxide film formed according to the conventional method and the present invention, respectively.
Figure 17B:
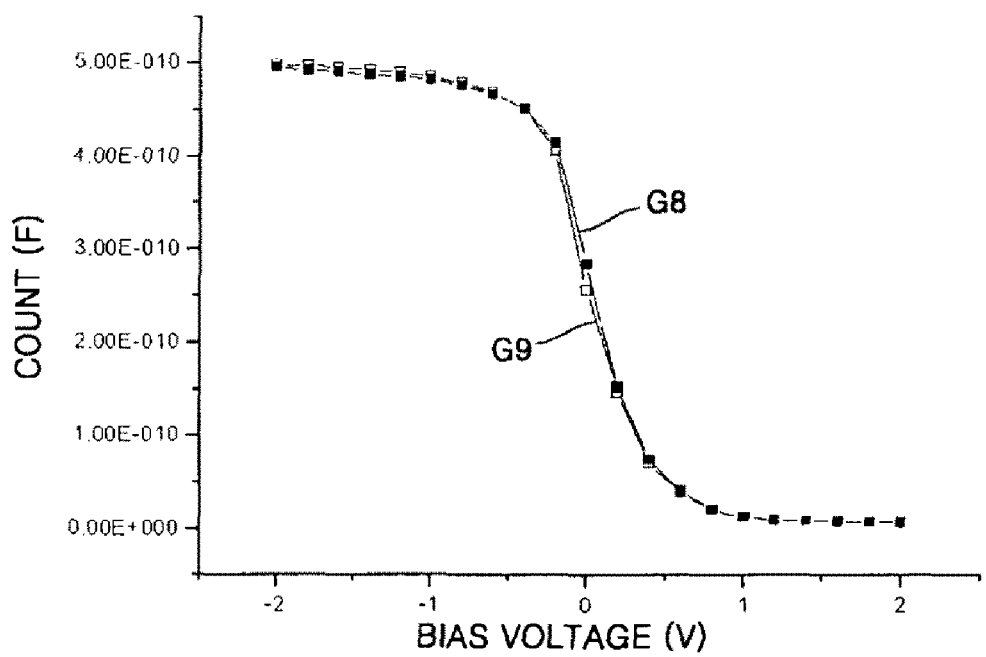

Next, FIGS. 17A and 17B show variation of capacitance with respect to bias voltage. FIG. 17A shows capacitance-voltage (C-V) variation with respect to a capacitor including an aluminum oxide film formed by a conventional method for manufacturing a high k-dielectric oxide film (hereinafter, referred to a "conventional capacitor"), and 17B shows C-V variation with respect to a capacitor including an AHO film according to the present invention (hereinafter, referred to as a "capacitor of the present invention").

In FIG. 17A, a sixth curve G6 shows variation of capacitance when bias voltages are applied to the conventional capacitor from positive (+) to negative (−), and a seventh curve G7 shows variation of capacitance when bias voltages are applied from negative (−) to positive (+).

In FIG. 17B, an eighth curve G8 shows variation of capacitance when bias voltages are applied to the capacitor of the present invention from positive (+) to negative (−), and a ninth curve G9 shows variation of capacitance when bias voltages are applied from negative (−) to positive (+).

As shown in FIG. 17A, there is a gap between the sixth curve G6 and the seventh curve G7, which is caused by trap existing in a high k-dielectric oxide film of the conventional capacitor, i.e., an aluminum oxide film.

On the other hand, as shown in FIG. 17B, there is not a gap between the eighth curve G8 and the ninth curve G9 unlike the sixth curve G6 and the seventh curve G7. This means that trap does not exist in a high k-dielectric oxide film, e.g., an AHO film or a material film formed of an AHO film and another high k-dielectric oxide film (e.g., 42, 62 of FIG. 19), included in the capacitor of the present invention or that trap having an even lower density than that in the conventional capacitor exists in the capacitor of the present invention.

The foregoing method for manufacturing a high k-dielectric oxide film according to the present invention (hereinafter, referred to as the "method of the present invention") can be applied to form a gate oxide film or a dielectric film of a capacitor. FIGS. 18 through 21 are cross-sectional views of capacitors of a semiconductor device, which include a dielectric film formed using the method of the present invention.

Figure 18:
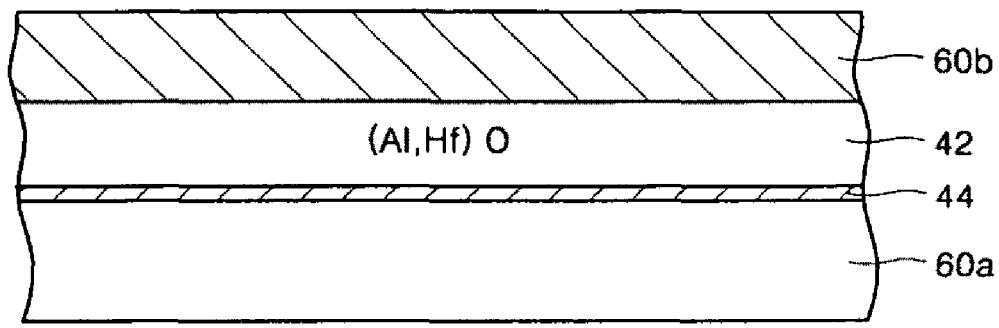
FIGS. 18 through 21 are cross-sectional views of capacitors having dielectric films formed using the method for manufacturing a high k-dielectric oxide film according to the embodiments of the present invention.

In the capacitor shown in FIG. 18, an oxidation barrier film 44 is formed on a lower electrode 60a, and an AHO(($Al_x$, $Hf_{1-x}$)$O_Y$) film 42 is formed as a high k-dielectric film on the oxidation barrier film 44. In the AHO(($Al_X$,$Hf_{1-X}$)$O_Y$) film 42, value "X" ranges from 0.1 to 0.9 and value "Y" ranges from 2 to 5. An upper electrode 60b is disposed on the AHO film 42. The lower electrode 60a is a silicon electrode coupled to a lower semiconductor substrate (not shown), and the oxidation barrier film 44 is an RTN film or a silicon oxynitride (SiON) film. The upper electrode 60b is formed of, for example, polysilicon. The AHO film 42 is a dielectric film obtained by the method of the present invention. In place of the AHO layer, any other equivalent dielectric film may be included in the capacitor as shown in FIG. 18 and other capacitors shown in FIGS. 19 through 21.

Figure 19:
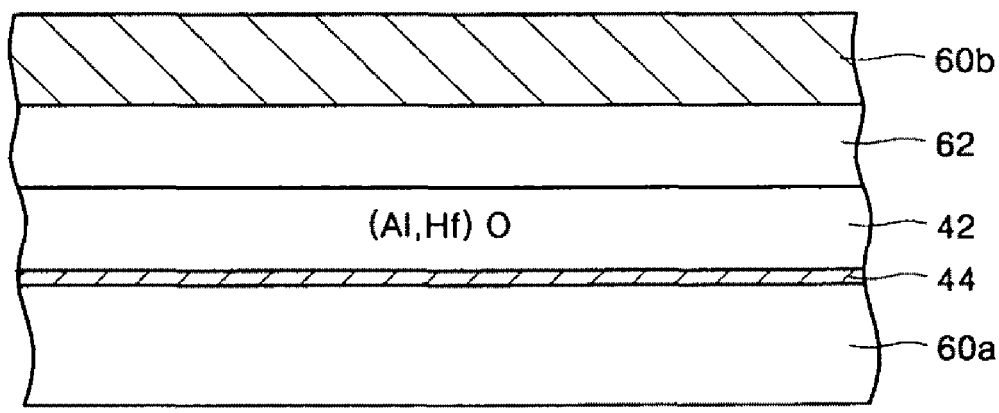

Meanwhile, as shown in FIG. 19, a dielectric layer, such as an $HfO_2$ layer, a $ZrO_2$ layer, or an STO layer, which has a dielectric constant higher than that of the AHO film 42, may be further formed between the upper electrode 60b and the AHO film 42. In FIG. 19, reference numeral 62 denotes a high k-dielectric film included between the AHO film 42 and the upper electrode 60b.

Figure 20:
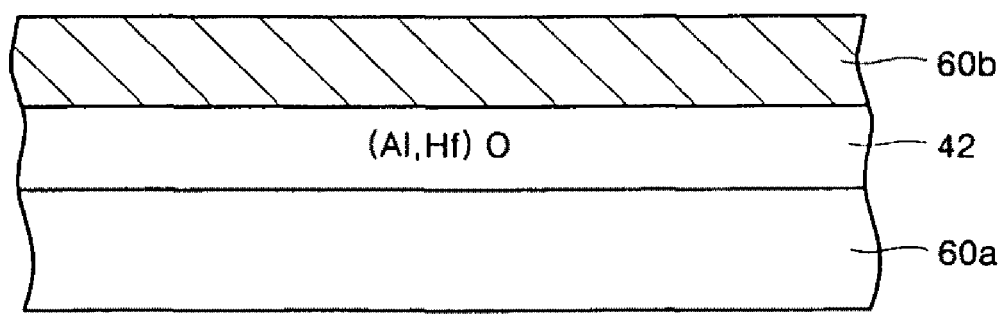

FIG. 20 shows a case where the oxidation barrier film 44 is excluded from the capacitor shown in FIG. 18. Likewise, a high k-dielectric film 62, as shown in FIG. 19, may be further formed between the AHO film 42 and the upper electrode 60b.

Figure 21:
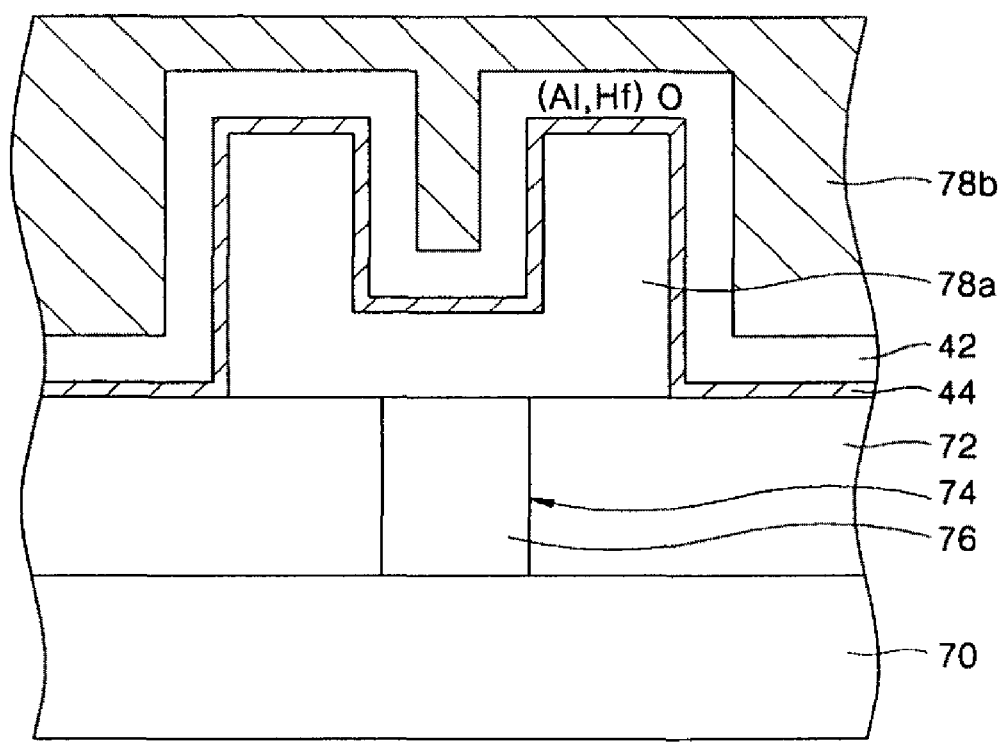

FIG. 21 shows a capacitor having sterical electrodes. Here, a lower electrode 78a has a cylinder shape and is coupled to a semiconductor substrate 70 through a conductive plug 76, which fills a contact hole 74 formed in an interlayer dielectric (ILD) 72. The lower electrode 78a is covered with an oxidation barrier film 44. The oxidation barrier film 44 may be selectively formed. The oxidation barrier film 44 is covered with an AHO film 42 having a predetermined thickness. The AHO film 42 is a dielectric film obtained by the method of the present invention. The AHO film 42 is covered with an upper electrode 78b formed of, for example, polysilicon. Likewise, a high k-dielectric film 62, as shown in FIG. 19, may be further formed between the upper electrode 78b and the AHO film 42. In this case, the oxidation barrier film 44 may be selectively formed. That is, since reactivity between the AHO film 42 and the lower electrode 78a is very low, the oxidation barrier film 44 may be formed if necessary.

Meanwhile, a method for manufacturing the capacitors shown in FIGS. 18 through 21 will be briefly described hereinafter.

A lower electrode 60a or 78a is formed to be coupled to a semiconductor substrate (not shown). Next, the semiconductor substrate where the lower electrode 60a or 78a is formed is loaded in an ALD apparatus, and a high k-dielectric oxide film 42 is formed as a dielectric film on the lower electrode 60a or 78a by the method of the present invention. Afterwards, the resultant structure where the high k-dielectric oxide film 42 is stacked is unloaded from the ALD apparatus. Then, an upper electrode 60b or 78b is formed on the high k-dielectric oxide film 42 in a predetermined deposition apparatus.

As shown in FIGS. 18, 19, and 21, the method for manufacturing the capacitors may further comprise forming an oxidation barrier film 44 between the lower electrode 60a or 78a and the high k-dielectric oxide film 42. Also, as shown in FIG. 19, a dielectric film 62, which has a dielectric constant higher than that of the high k-dielectric oxide film 42, may be further formed between the upper electrode 60b or 78b and the high k-dielectric oxide film 42. Here, although the dielectric film 62 is preferably formed in an ALD apparatus, it is possible to form the dielectric film 62 in a deposition apparatus other than ALD apparatuses, e.g., a chemical vapor deposition (CVD) apparatus.

As described above, the method for manufacturing a high k-dielectric oxide film, e.g., an AHO film, according to the present invention comprises depositing aluminum ions and hafnium ions on a semiconductor substrate by using a chemical reaction between precursors of aluminum and hafnium and simultaneously oxidizing the aluminum ions and hafnium ions. Accordingly, unlike the conventional method requiring at least two ALD apparatuses, the present invention requires only one ALD apparatus. As a result, in the present invention, the size of an apparatus can be reduced, productivity can be enhanced, and manufacturing costs can be lowered. Further, the high k-dielectric oxide film, e.g., the AHO film, of the present invention exhibits high dielectric constant as well as low leakage current and trap density. Consequently, a capacitor including the high k-dielectric oxide film as a dielectric film also exhibits low leakage current and trap density.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, those of ordinary skill in the art can form a capacitor including AHO films on and under a high k-dielectric film.

What is claimed is:

1. A capacitor of a semiconductor device, the capacitor comprising:
   an interlayer dielectric (ILD) film on a semiconductor substrate, the ILD film including a conductive plug therein;
   a lower electrode formed on the ILD film;

an AHO (($Al_x, Hf_{1-x})O_y$) film formed on the lower electrode;

an upper electrode formed on the AHO (($Al_x, Hf_{1-x})O_y$) film; and an oxidation barrier film formed between the lower electrode and the AHO (($Al_x, Hf_{1-x})O_y$) film;

a dielectric film having a dielectric constant that is higher than that of the AHO (($Al_x, Hf_{1-x})O_y$) film between the upper electrode and the AHO (($Al_x, Hf_{1-x})O_y$) film, wherein the dielectric film is an $HfO_2$ layer, a $ZrO_2$ layer, or an STO layer, wherein the dielectric film is directly in contact with the upper electrode, and wherein the lower electrode, the oxidation barrier film and the AHO film include a recess above the conductive plug, and the recess is filled by the upper electrode.

* * * * *

UNITED STATES PATENT AND TRADEMARK OFFICE
CERTIFICATE OF CORRECTION

PATENT NO. : 8,143,660 B2  Page 1 of 1
APPLICATION NO. : 10/797046
DATED : March 27, 2012
INVENTOR(S) : Jung-hyun Lee et al.

It is certified that error appears in the above-identified patent and that said Letters Patent is hereby corrected as shown below:

On the Title Page, Item (75) should read,

(75) Inventors: Jung-hyun Lee, Gyeonggi-do (KR); Bum-seok Seo, Seoul (KR); Yo-sep Min, Gyeonngi-do (KR); Young-jin Cho, Gyeonggi-do (KR)

Signed and Sealed this
Seventh Day of August, 2012

David J. Kappos
*Director of the United States Patent and Trademark Office*